(12) United States Patent
Jiang et al.

(10) Patent No.: US 11,348,943 B2
(45) Date of Patent: May 31, 2022

(54) NON-VOLATILE FERROELECTRIC MEMORY AND METHOD OF PREPARING THE SAME

(71) Applicant: Fudan University, Shanghai (CN)

(72) Inventors: Anquan Jiang, Shanghai (CN); Xiaojie Chai, Shanghai (CN); Jianwei Lian, Shanghai (CN); Jun Jiang, Shanghai (CN); Menghan Ao, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 16/931,721

(22) Filed: Jul. 17, 2020

(65) Prior Publication Data
US 2021/0036017 A1   Feb. 4, 2021

(30) Foreign Application Priority Data

Jul. 31, 2019 (CN) .......................... 201910701759.5

(51) Int. Cl.
*H01L 27/11585* (2017.01)

(52) U.S. Cl.
CPC .............................. *H01L 27/11585* (2013.01)

(58) Field of Classification Search
CPC ......... H01L 27/11585; H01L 29/66969; H01L 29/8615; H01L 29/24; H01L 27/1021; H01L 29/6684; H01L 27/11502; H01L 29/7839; G11C 11/221; G11C 13/0069; G11C 11/2275
See application file for complete search history.

(56) References Cited

U.S. PATENT DOCUMENTS

| | | | |
|---|---|---|---|
| 4,895,812 A | * | 1/1990 | Wang ...................... H01L 41/29 148/DIG. 93 |
| 2009/0039341 A1 | | 2/2009 | Marsman et al. |
| 2014/0087484 A1 | | 3/2014 | Sun et al. |
| 2017/0162250 A1 | | 6/2017 | Slesazeck et al. |
| 2017/0338350 A1 | | 11/2017 | Flachowsky et al. |
| 2018/0096717 A1 | * | 4/2018 | Jiang ...................... H01L 28/55 |
| 2018/0277191 A1 | | 9/2018 | Yoo |
| 2019/0115353 A1 | | 4/2019 | O'Brien et al. |
| 2019/0131458 A1 | | 5/2019 | Yoo |

FOREIGN PATENT DOCUMENTS

| | | |
|---|---|---|
| CN | 105655342 A | 6/2016 |
| CN | 107230676 A | 10/2017 |
| WO | 2016115826 A1 | 7/2016 |
| WO | 2017/177376 A1 | 10/2017 |
| WO | 2019/047489 A1 | 3/2019 |

* cited by examiner

*Primary Examiner* — Julia Slutsker
(74) *Attorney, Agent, or Firm* — Warner Norcross + Judd LLP

(57) ABSTRACT

The present disclosure relates to a non-volatile ferroelectric memory and a method of preparing the same. The ferroelectric memory includes a ferroelectric storage layer, a first electrode and a second electrode; the first electrode and the second electrode each include a buried conductive layer formed by patterning in a surface of the ferroelectric storage layer and an electrode layer formed on the buried conductive layer; and when a write signal in a certain direction is applied between the first electrode and the second electrode, the electric domains of a part of the ferroelectric storage layer between a pair of the buried conductive layers are enabled to be reversed, so that a domain wall conductive passage that electrically connects the first electrode and the second electrode can be established.

16 Claims, 10 Drawing Sheets

NON-VOLATILE FERROELECTRIC MEMORY AND METHOD OF PREPARING THE SAME

CROSS-REFERENCE TO RELATED APPLICATION

This application claims priority from Chinese patent application CN201910701759.5, filed on Jul. 31, 2019, the entirety of which is hereby incorporated by reference herein and forms a part of the specification.

FIELD OF THE INVENTION

The present disclosure pertains to a technical field of ferroelectric storage, and relates to a non-volatile ferroelectric memory including a buried conductive layer formed by patterning in a surface layer of a ferroelectric storage layer, as well as a method of preparing the ferroelectric memory

BACKGROUND OF THE INVENTION

With the rapid development of information technology, the information processing capacity is continuously improved, the amount of data is rapidly increasing, and new technologies such as cloud computing, cloud storage, and the Internet of Things are emerging one after another, which raise higher and higher requirements on memory performance, especially in terms of low energy consumption, high capacity, long-term data retention, etc.

After more than thirty years of rapid development, flash memory devices based on floating gate structures have achieved great success in the market. However, with the continuous advancement of the development of semiconductor process technology nodes, the miniaturizability of flash memory devices is facing severe challenges, and has now approached the limit of physical size. The development of new miniaturizable non-volatile memory has become a hot spot in the development of current information technology.

The storage medium layer of a ferroelectric memory is a ferroelectric thin film layer having a reversible (or "switchable") electric domain. Currently, the fastest speed of reversing an electric domain that can be measured in a lab can reach up to 0.2 ns. In fact, it can be even faster. Usually, the reversing speed of electric domain determines the read-write time of the memory, a coercive voltage for electric domain reversing determines the read-write voltage of elements, and it will decrease almost in equal proportion to a reduction of the thickness of the thin film. Therefore, the ferroelectric memory has such advantages as fast speed of data reading, low drive voltage, high density of storage, etc., and has earned widespread attention and rapid development in recent years.

JIANG Anquan et al. filed a patent application with the publication number WO2017/177376A1, entitled "Large Current-Readout Ferroelectric Single-crystal Thin Film Memory as Well as Method of Preparing the Same and Method of Operating the Same", and a patent application with the publication number WO2019/047489A1, entitled "Ferroelectric Memory Integrated Circuit as Well as Method of Operating the Same and Method of Preparing the Same". The above patent applications disclose a unique non-destructive read-out (NDRO) ferroelectric memory, which uses the direct current conductive characteristic of domain wall to store information. Moreover, the above patent applications also specifically disclose a specific ferroelectric storage device structure in which a domain wall conductive passage is formed in a programming projected block, wherein the programming projected block is formed by using, for example, a semiconductor etching process to perform patterning in a ferroelectric thin film or ferroelectric substrate surface.

SUMMARY OF THE INVENTION

The object of the present disclosure includes improving the storage performance of a ferroelectric memory that stores information based on domain wall conductive passages.

According to an aspect of the invention, a non-volatile ferroelectric memory is provided, which includes a ferroelectric storage layer, a first electrode and a second electrode, a polarization direction of an electric domain in the ferroelectric storage layer being substantially not parallel with a normal line direction of the ferroelectric storage layer;

wherein the first electrode and the second electrode each include a buried conductive layer formed by patterning in a surface of the ferroelectric storage layer and an electrode layer formed on the buried conductive layer; and when a write signal in a certain direction is applied between the first electrode and the second electrode, the electric domain of a part of the ferroelectric storage layer between a pair of the buried conductive layers is enabled to be reversed, so that a domain wall conductive passage that electrically connects the first electrode and the second electrode can be established.

According to an additional or alternative solution, the buried conductive layer forms an ohmic contact with the electrode layer.

According to an additional or alternative solution, the buried conductive layer is formed by partially performing blackening treatment, diffusion treatment, or ion implantation treatment on the surface of the ferroelectric storage layer.

According to an additional or alternative solution, the buried conductive layer is formed by performing blackening treatment on the surface of the ferroelectric storage layer, wherein during the blackening treatment, one or more of lithium, chromium, iron, zinc, aluminum, magnesium, copper, cobalt, nickel, manganese and titanium are used to reduce the surface of the ferroelectric storage layer, so as to realize partial conductive treatment on the ferroelectric storage layer.

According to an additional or alternative solution, the buried conductive layer is formed by performing diffusion treatment on the surface of the ferroelectric storage layer, wherein during the diffusion treatment, one or more of silver, copper, chromium, cobalt, titanium, iridium and ruthenium are used as a diffusion source to diffuse onto the surface of the ferroelectric storage layer, so as to realize partial conductive treatment on the ferroelectric storage layer.

According to an additional or alternative solution, the buried conductive layer is formed by performing ion implantation treatment on the surface of the ferroelectric storage layer, wherein during the ion implantation treatment, one or more of aluminum, silver, gold, platinum, copper, cobalt, chromium, titanium, ruthenium and iridium are implanted onto the surface of the ferroelectric storage layer, so as to realize partial conductive treatment on the ferroelectric storage layer.

According to an additional or alternative solution, the electric domain in the ferroelectric storage layer has an electric domain component in the direction of a horizontal connection line between the buried conductive layers.

According to an additional or alternative solution, the resistivity of the buried conductive layer is of the order of $10^{-5}$-$10^{12}$ Ω·cm.

According to an additional or alternative solution, a contact resistance of the buried conductive layer and the electrode layer is less than or equal to 50MΩ.

According to an additional or alternative solution, the surface of the ferroelectric storage layer that is used for forming the buried conductive layer through the conductive treatment is a planar surface, an uneven surface or an irregularly shaped surface, and the buried conductive layer extends inward from the surface of the ferroelectric storage layer.

According to an additional or alternative solution, the electrode layer partially or completely covers the buried conductive layer.

According to an additional or alternative solution, when a write signal in a direction opposite to said certain direction is applied between the first electrode and the second electrode, the electric domain of the part of the ferroelectric storage layer between the pair of the buried conductive layers that has been reversed is enabled to be switched back to an initial polarization direction so that that the domain wall conductive passage disappears.

According to an additional or alternative solution, the domain wall conductive passage is a domain wall conductive passage with unidirectional direct current conductive characteristic.

According to an additional or alternative solution, the ferroelectric storage layer is a ferroelectric single-crystal material.

According to an additional or alternative solution, the ferroelectric storage layer is selected from lithium tantalate (LiTaO$_3$), lithium niobate (LiNbO$_3$), or lithium tantalate (LiTaO$_3$) and lithium niobate (LiNbO$_3$) doped with MgO, Mn$_2$O$_5$, Fe$_2$O$_3$ or La$_2$O$_3$; or the ferroelectric storage layer is blackened lithium tantalate (LiTaO$_3$) or lithium niobate (LiNbO$_3$).

The present disclosure also provides a method of preparing a non-volatile ferroelectric memory, which includes the steps of:

providing a substrate containing a ferroelectric storage layer;

performing conductive treatment on a surface of the ferroelectric storage layer by patterning to form at least one pair of buried conductive layers; and depositing an electrode layer to form a first electrode and a second electrode each including the buried conductive layer and a corresponding electrode layer formed on the buried conductive layer;

wherein a polarization direction of an electric domain in the ferroelectric storage layer is substantially not parallel with a normal line direction of the ferroelectric storage layer, and when a write signal in a certain direction is applied between the first electrode and the second electrode, the electric domain of a part of the ferroelectric storage layer between the pair of the buried conductive layers are enabled to be reversed, so that a domain wall conductive passage that electrically connects the first electrode and the second electrode can be established.

According to an additional or alternative solution, the method further includes the step of: performing a cleaning treatment after the conductive treatment.

According to an additional or alternative solution, in the step of the conductive treatment, the surface of the ferroelectric storage layer is partially subjected to blackening treatment, diffusion treatment, or ion implantation treatment.

According to an additional or alternative solution, in the step of the conductive treatment, one or more of lithium, chromium, iron, zinc, aluminum, magnesium, copper, cobalt, nickel, manganese and titanium are used to partially reduce the surface of the ferroelectric storage layer, so as to realize the blackening treatment.

According to an additional or alternative solution, during the blackening treatment, the substrate is placed in lithium magnesium silicate, lithium carbonate or lithium chlorine powder, and burying-sintered in a vacuum, a protective atmosphere or a reducing atmosphere under a temperature condition of 100° C.-600° C.

According to an additional or alternative solution, the lithium, chromium, iron, zinc, aluminum, magnesium, copper, cobalt, nickel, manganese, or titanium used in the step of the conductive treatment is metal powders, or metal thin films formed by a thin film deposition process.

According to an additional or alternative solution, in the step of the conductive treatment, the growth of the diffusion source occurs at a temperature required for the diffusion treatment, so that the generation of the diffusion source occurs in synchronization with the diffusion treatment.

According to an additional or alternative solution, in the step of the conductive treatment, one or more of silver, copper, chromium, cobalt, titanium, iridium and ruthenium are used as a diffusion source to diffuse onto the surface of the ferroelectric storage layer.

According to an additional or alternative solution, the silver, copper, chromium, cobalt, titanium, iridium or ruthenium used in the step of the conductive treatment is metal powders, or metal thin films formed by a thin film deposition process.

According to an additional or alternative solution, in the step of the conductive treatment, one or more of aluminum, silver, gold, platinum, copper, cobalt, chromium, titanium, ruthenium and iridium are used as an ion implantation source to implant metal ions onto the surface of the ferroelectric storage layer.

According to an additional or alternative solution, a diffused metal layer is formed before the electrode layer is deposited; and the diffused metal layer performs a diffusion treatment on the surface of the ferroelectric storage layer at the same time of depositing the electrode layer or after the electrode layer is deposited, so as to complete the conductive treatment.

The above features, operations and advantages of the present disclosure will become more apparent from the following description and accompanying drawings.

BRIEF DESCRIPTION OF THE DRAWINGS

The above and other objects and advantages of the present disclosure will be made more complete and clear from the following detailed description in conjunction with the accompanying drawings, wherein identical or similar elements are denoted by identical reference numerals.

Figure 1:
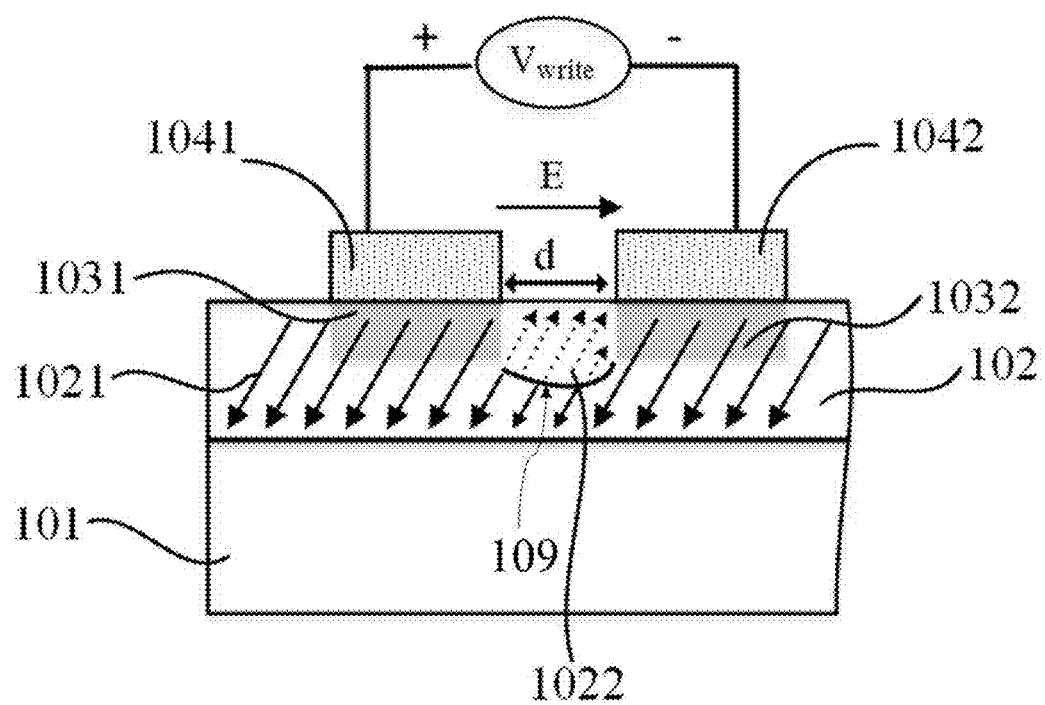
FIG. 1 is a schematic cross-sectional structural view of a non-volatile ferroelectric memory according to an embodiment of the present disclosure.

Reference numbers in the drawings: 101: substrate; 102: ferroelectric storage layer; 1031, 1032: buried conductive layer; 1041, 1042: electrode layer; 1021, 1022: polarization direction; 109: domain wall conductive passage; 206, 306, 406: covering layer; 2051, 2052, 3051, 3052, 4051, 4052: window region; 2071, 2072: reduction metal layer; 4071, 4072: diffused metal layer.

DETAILED DESCRIPTION OF THE EMBODIMENT(S) OF THE INVENTION

The present disclosure will be described in detail below with reference to the drawings and specific embodiments. These embodiments are implemented within the technical solutions of the present disclosure, and detailed implementations and specific operation processes are given, but the scope of protection of the present disclosure is not limited to the following embodiments.

In the drawings, the thicknesses of layers and regions have been exaggerated for clarity. The dimensional scaling relationship among the portions shown in the drawings does not reflect an actual dimensional scaling relationship.

In the following embodiments, an electric domain direction or polarization direction is illustratively given for the purpose of a clear description. However, it is to be understood that the electric domain direction or polarization direction of ferroelectric memory is not limited to the direction shown in the embodiment in the drawings.

In the following embodiments, the ferroelectric single-crystal thin film layer can be a single-crystal thin film formed by epitaxial single-crystal growth, or can be a thin film layer formed by being separated or cut from a single crystal, which refers to a single-crystal structure or a quasi single-crystal structure having no "crystal boundaries" of a poly-crystal structure inside. That is, each storage unit of the finished non-destructive readout ferroelectric memory has a single-crystal structure, and there is no limitation to the size of the unit.

The applicant has found that in the patent with the publication number WO2017/177376A1, entitled "Large Current-Readout Ferroelectric Single-crystal Thin Film Memory as Well as Method of Preparing the Same and Method of Operating the Same", and the patent with the publication number WO2019/047489A1, entitled "Ferroelectric Memory Integrated Circuit as Well as Method of Operating the Same and Method of Preparing the Same", in the process of pattern-forming ferroelectric memory units with a programming projected block structure, an ion etching process in the semiconductor manufacturing process is generally used to etch an ferroelectric material, thus forming a programming projected block structure; however, this etching process is likely to damage the ferroelectric material (especially the crystal structure of the ferroelectric material around the programming projected block), resulting in a deterioration of ferroelectric performance, a drop of information retention ability of electric domain in the ferroelectric storage layer, and a reduction in the on-state read current, which greatly affects the performance of the ferroelectric memory. Moreover, the applicant has also found that the ferroelectric memory with this projected block structure has a superior storage performance to another ferroelectric memory without a projected block structure (i.e., the ferroelectric thin film layer is of a flat layer structure) for example disclosed in WO2017/177376A1.

FIG. 1 is a schematic cross-sectional structural view of a non-volatile ferroelectric memory according to an embodiment of the present disclosure. The ferroelectric memory of this embodiment mainly includes a substrate 101 containing a ferroelectric storage layer 102, and electrode layers 1041 and 1042, and in particular includes buried conductive layers 1031 and 1032 formed by patterning in a surface layer of the ferroelectric storage layer 102. The electrode layers 1041 and 1042 are disposed corresponding to the buried conductive layers 1031 and 1032 respectively. Specifically, the electrode layer 1041 forms an ohmic contact with the buried conductive layer 1031, so that they constitute a first electrode (also referred to as "left electrode"), and the electrode layer 1042 may form an ohmic contact with the buried conductive layer 1032, so that they constitute a second electrode (also referred to as "right electrode"); the first electrode and the second electrode may be used as a read-write electrode pair of the ferroelectric memory, wherein the first electrode and the second electrode may be disposed separately from each other. In an embodiment, as shown in FIG. 1, there is a spacing d between the first electrode and the second electrode. The specific size of the spacing d may be greater than or equal to 2 nanometers and less than or equal to 1 micrometer, more optionally greater than or equal to 5 nanometers and less than or equal to 0.5 micrometer, e.g., 10 nanometers, 100 nanometers, and the like. It will be understood that the smaller the spacing d is, the more advantageous it is for increasing the storage density of the ferroelectric memory, and the more advantageous it is for reducing the write voltage and read voltage, increasing the read current, and resulting in a smaller read power consumption and write power consumption. Therefore, the ferroelectric memory of the embodiment of the present disclosure can be scaled down.

The substrate 101 may be formed of various base materials commonly used in a ferroelectric memory, such as Si, $SrTiO_3$ or $LiNbO_3$. Generally, the selection of the material of the substrate 101 may be determined by the material of the ferroelectric storage layer 102 or the like altogether. In an embodiment, the substrate 101 may be a single-crystal Si substrate, which is easily compatible with semiconductor CMOS process and facilitates mass production. In addition, in the case where the ferroelectric storage layer 102 is formed of a single crystal material, a base material such as $SrTiO_3$ or $LiNbO_3$ is selected according to the lattice constant requirement of the ferroelectric storage layer 102 in order to obtain an epitaxial thin film layer with excellent performance.

The ferroelectric storage layer 102 may be formed on the initial substrate 101 through a process including and not limited to, a bonding process, a thin film formation process, etc., thereby forming the substrate 101 containing the ferroelectric storage layer 102.

The ferroelectric storage layer 102 may be a ferroelectric thin film layer with a suitable domain structure. Generally, the ferroelectric storage layer 102 exhibits an insulating characteristic or has a relatively high resistance before being subjected to the conductive treatment to be described illustratively in the following examples, and it is easy to form a passivation layer on a surface of the ferroelectric storage layer 102. For the ferroelectric storage layer 102, the ferroelectric single crystal material (for example, a ferroelectric single crystal thin film) disclosed in the patent No. WO2017/177376A1 may be specifically selected so that the on-state read current can be greatly increased, thereby improving the performance of electrical storage of this embodiment. Therefore, the full text of the patent No. WO2017/177376A1 is hereby incorporated by reference.

However, it should be understood that the ferroelectric storage layer 102 of the embodiment of the present disclosure is not limited to a ferroelectric single crystal layer, and it may also be a polycrystalline ferroelectric thin film layer. The thickness of the ferroelectric storage layer 102 is greater than or equal to the depth or thickness of the buried conductive layer.

As shown in FIG. 1, a spontaneous polarization direction or initial polarization direction 1021 of the ferroelectric domain in the ferroelectric storage layer 102 is the direction shown in FIG. 1, and after the electric domain of the ferroelectric storage layer 102 between the buried conductive layers 1031 and 1032 is reversed, the polarization direction 1022 is completely opposite to the polarization direction 1021. The polarization direction of the electric domain in the ferroelectric storage layer 102 is substantially not parallel with a normal line direction of the ferroelectric storage layer 102, that is, an included angle between the normal line of the ferroelectric storage layer 102 and the polarization direction of the electric domain is not equal to 0° or 180°, and may for example be 45°, so that the ferroelectric domain has a component in the in-plane of the ferroelectric storage layer 102 (for example, the spontaneous polarization of the ferroelectric domain has an electric domain component on the surface of the ferroelectric storage layer 102 or on a horizontal connection line between the buried conductive layers 1031 and 1032), thus making it easy to implement a write operation for controlling electric domain reversing.

In an embodiment, the buried conductive layer 1031/1032 may be a high-conductivity buried region having an increased carrier concentration after the surface layer of the ferroelectric storage layer 102 is partially subjected to a conductive treatment, and the resistivity thereof is optionally of the order of $10^{-5}$-$10^{12}$ Ω·cm (e.g. around $10^{-2}$ Ω·cm, around $10^{-1}$ Ω·cm or around 10Ω·cm); it will be understood that the conductive treatment corresponding to the buried conductive layer 1031/1032 is defined relative to the initial conductive characteristic (such as the initial insulating characteristic) of the ferroelectric storage layer 102, and this conductive treatment can greatly improve its conductive characteristic; the conductive treatment corresponding to the buried conductive layer 1031/1032 includes a process of greatly increasing the carrier concentration of the ferroelectric storage layer 102 to reduce the resistivity of the ferroelectric storage layer 102, and the buried conductive layer 1031/1032 formed by the conductive treatment can be changed from the insulating characteristic to a semiconductor characteristic having a certain carrier concentration, and thus the resistivity is effectively reduced. Therefore, the conductive treatment includes a process of changing the ferroelectric storage layer 102 from an insulating characteristic to a semiconductor characteristic having a relatively low resistivity.

As shown in FIG. 1, a lower surface of the electrode layer 1041/1042 may form an ohmic contact with an upper surface of the buried conductive layer 1031/1032, and they are controlled to form a relatively low contact resistance which is less than or equal to 50MΩ (for example 100Ω or less). It will be understood that the contact resistance of the buried conductive layer 1031/1032 and the electrode layer 1041/1042 may be controlled by controlling the conductive treatment process of the buried conductive layer 1031/1032, for example, by controlling an ion doping concentration. The buried conductive layer 1031/1032 and the electrode layer 1041/1042 may have the same shape and/or pattern, or may have different shapes and/or patterns.

In an embodiment, the buried conductive layers 1031 and 1032 may be formed by partially performing blackening treatment, diffusion treatment, or ion implantation treatment on the upper surface of the ferroelectric storage layer 102. Therefore, it is possible to avoid using the semiconductor etching process for forming a programming projected block disclosed, for example, in the patent No. WO2017/177376A1, thus having little damage to the ferroelectric memory layer 102. The specific conductivity treatment will not be limited to the blackening treatment, ion implantation treatment or diffusion treatment, but other methods may also be used to increase the carrier concentration on the surface of the ferroelectric storage layer to increase its conductivity and reduce the resistivity of the surface layer of the substrate, which finally improves the ferroelectric domain retention and the magnitude of the on-state read current. The buried conductive layers 1031, 1032 and the ferroelectric storage layer 102 may not have a relatively clear interface as shown in FIG. 1; for example, a gradually-changing transition interface that is not shown in FIG. 1 may be formed between them. The specific structure and/or characteristics of the buried conductive layers 1031 and 1032 will be exemplified in detail in the preparation aspects of the following examples.

It should be noted that the surface of the ferroelectric storage layer 102 is not limited to the planar shape shown in FIG. 1, and the surface of the ferroelectric storage layer 102 that is used for forming the buried conductive layer 1031/1032 by the conductive treatment may also be a non-planar surface of the ferroelectric storage layer 102 having the shape of projected blocks, pits, etc., or may also be a surface of the ferroelectric storage layer 102 having other irregular shapes; the buried conductive layer 1031/1032 may extend inwardly of the ferroelectric storage layer from the surface having various irregular shapes.

In view of the conductive characteristic of the buried conductive layer 1031/1032, when a write signal (such as the write signal $V_{write}$ shown in FIG. 1) fixed in a certain direction is applied between the first electrode and the second electrode, the electric domain(s) of a part of the ferroelectric storage layer between the buried conductive layer 1031 and the buried conductive layer 1032 is enabled to be reversed, that is, the electric domain(s) is reserved into the electric domain polarization direction 1022 in the direction shown by the dotted arrow in FIG. 1, so that a domain wall conductive passage 109 electrically connecting the first electrode and the second electrode can be established; specifically, the write signal $V_{write}$ may be a unidirectional pulsed voltage signal, which is not an electrical signal having an alternative current (AC) characteristic. In an embodiment, the domain wall conductive passage 109 may be a passage 109 having a unidirectional direct current (DC) conductive characteristic, which can be turned on to obtain a read current when a DC read signal in a certain direction is biased, which is therefore easy to read. The domain wall conductive passage 109 still maintains the conductive characteristic after reading, and thus the ferroelectric memory of the embodiment of the present disclosure has a characteristic of non-destructive read-out or non-volatile characteristic.

In an embodiment, when a write signal in a direction opposite to said certain direction (for example, a write signal in a direction opposite to the direction of the DC write signal $V_{write}$ as shown in FIG. 1) is applied between the first electrode and the second electrode, the reversed electric domain in the ferroelectric storage layer 102 between the first electrode and the second electrode can be reversed back to the initial polarization direction (i.e., the initial polarization direction 1021 of the ferroelectric storage layer 102 in FIG. 1), so that the domain wall conductive passage 109 disappears (not shown in the figure). A DC read signal in a certain direction can be applied between the first electrode and the second electrode to judge whether the domain wall conductive passage 109 is established. When the domain wall conductive passage 109 is established, it indicates that a first logic state (e.g., data "0"/"1") is stored, and when the domain wall conductive passage 109 disappears, it indicates that a second logic state (e.g., data "1"/"0") is stored. Therefore, the first electrode and the second electrode also constitute a read-write electrode pair of the ferroelectric memory.

In the ferroelectric memory of the embodiment shown in FIG. 1, techniques such as blackening, metal atom diffusion, or metal ion implantation may be used to form the buried conductive layers 1031 and 1032, which may avoid a great damage to the ferroelectric memory layer 102 caused by the semiconductor etching process. Therefore, the planar electrode layers 1041 and 1042 can be nondestructively extended in the thickness direction of the ferroelectric storage layer 102, so that the buried conductive layer 1031 and the electrode layer 1041 can integrally form the first electrode, and the buried conductive layer 1032 and the electrode layer 1042 can integrally form the second electrode; meanwhile, the ferroelectric storage medium between the first electrode and the second electrode (for example, the ferroelectric storage medium between the buried conductive layers 1031 and 1032) can be raised relative to the buried conductive layers 1031 and 1032, so that the first electrode, the second electrode, and the ferroelectric storage medium therebetween can constitute a capacitor structure of approximately parallel plates. Therefore, the ferroelectric memory of the embodiment shown in FIG. 1 can greatly increase the retention time of the written electric domain information (i.e., logic state information) and the magnitude of the readout current.

Figure 2:
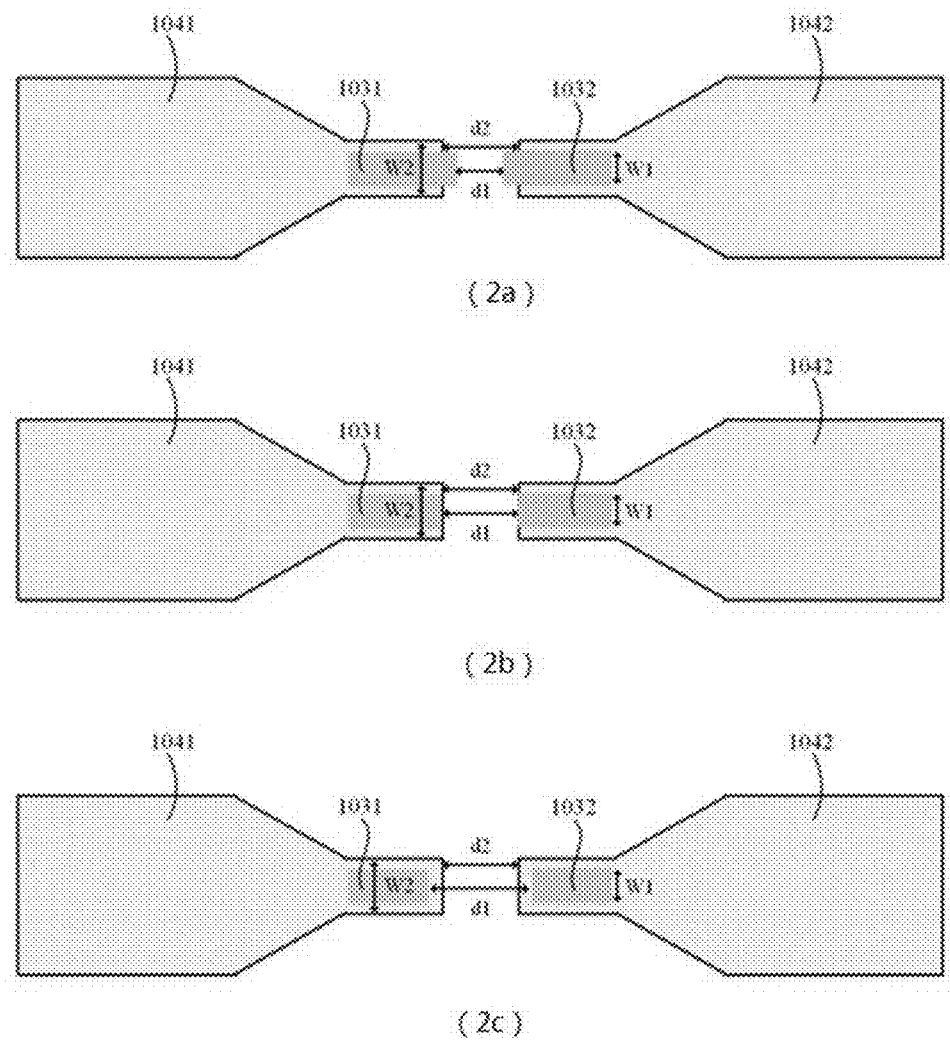
FIG. 2 is a schematic plan structural view of a first electrode and a second electrode of a ferroelectric memory according to an embodiment of the present disclosure, wherein FIGS. (2a), (2b), and (2c) respectively show three examples.

FIG. 2 is a schematic plan structural view of a first electrode and a second electrode of a ferroelectric memory according to an embodiment of the present disclosure, wherein FIGS. (2a), (2b), and (2c) respectively show three examples. As shown in FIG. 2, the positions of the electrode layers 1041/1042 may partially or completely overlap with the positions of the buried conductive layers 1031/1032. For example, in FIG. 2(a), the electrode layer 1041/1042 covers most of the buried conductive layer 1031/1032, the spacing d2 between the electrode layers 1041 and 1042 is greater than the spacing d1 between the buried conductive layer 1031 and 1032, and the width W2 of the electrode layer 1041/1042 above the buried conductive layer 1031/1032 is also greater than the width W1 of the buried conductive layer 1031/1032; in FIG. 2(b), the electrode layer 1041/1042 substantially covers the buried conductive layer 1031/1032, the spacing d2 between the electrode layers 1041 and 1042 is substantially equal to the spacing d1 between the buried conductive layer 1031 and 1032, and the width W2 of the electrode layer 1041/1042 above the buried conductive layer 1031/1032 is greater than the width W1 of the buried conductive layer 1031/1032; and in FIG. 2(c), the electrode layer 1041/1042 completely covers the buried conductive layer 1031/1032, the spacing d2 between the electrode layers 1041 and 1042 is less than the spacing d1 between the buried conductive layer 1031 and 1032, and the width W2 of the electrode layer 1041/1042 above the buried conductive layer 1031/1032 is greater than the width W1 of the buried conductive layer 1031/1032.

It will be understood that the specific shape of the electrode layer 1041/1042 is not limited to the above embodiment, and the shape, size and the like thereof may be designed according to specific needs.

Figure 3:
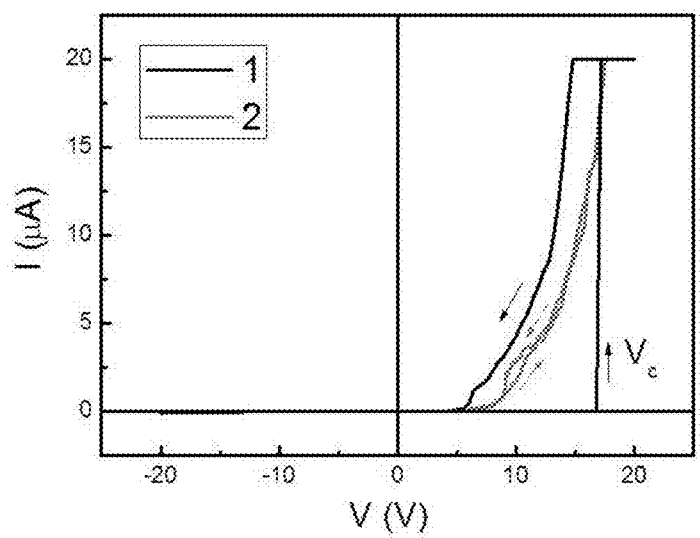
FIG. 3 is a schematic current-voltage (I-V) graph of a read-write electrode pair of a ferroelectric memory test sample according to an embodiment of the present disclosure.

FIG. 3 is a schematic current-voltage (I-V) graph of a read-write electrode pair of a ferroelectric memory test sample according to an embodiment of the present disclosure, wherein the embedded conductive layer of the read-write electrode pair is illustratively formed by patterning using the blackening treatment method.

As shown in curve 1 in FIG. 3, a voltage scan from −20V to +20V is performed on the read-write electrode pair (i.e., the first electrode and the second electrode) of the ferroelectric memory, and an I-V curve measurement is performed. It can be found that the current suddenly jumps from the off-state to the on-state at a coercive voltage Vc approximately equal to 17V, and the maximum current can reach 20 µA, which indicates that the electric domain of a part of the ferroelectric storage layer between the read-write electrode pair is reversed, and a write operation of the logic state information "1" is completed. When a voltage scan from 0V to 20V is performed again on the above test sample device, it can be found that the device is always in the on-state (as shown by the I-V curve of curve 2 in FIG. 3), which indicates that the state of the above written logic information "1" is well maintained; on the contrary, when a write voltage of −20V is applied, the electric domain of the part of the ferroelectric storage layer between the above read-write electrode pair is reversed back to the initial state. After a voltage scan from 0V to 20V is performed again on the measured I-V curve, it is found that the curve is restored to the state corresponding to the original curve 1, which indicates that the write operation of the logic state information "0" has been completed. Therefore, when the read voltage is fixed between 0 and 16.5V, the on/off current information corresponding to two different electric domain states and written under the above +/−20V write voltage bias conditions can be read out.

The ferroelectric memory of the above embodiment has a simple structure and low cost. The introduction of the buried conductive layer can avoid patterning such as etching on the surface of the ferroelectric storage layer. A projected block-like structure may be formed between a pair of buried conductive layers in the ferroelectric storage layer, and the electric domain in the projected block can be repeatedly reversed under the action of a write signal, so that the projected block can be defined as a "programming projected block"; therefore, on one hand, there is little damage to the ferroelectric storage medium during the preparation process, and the storage performance (such as data retention performance and on-state read current, etc.) is improved. For example, the on-state read current can reach the order of $10^{-6}$ A. On the other hand, the advantages such as long retention time of the written electric domain information that can be achieved by the programming projected block structure (for example, the first electrode, the second electrode and the ferroelectric storage medium between them can constitute a capacitor structure of approximately parallel plates) in terms of storage performance are maintained or fully utilized. Furthermore, part of the surface of the ferroelectric storage layer contacted by the electrode layer of the present disclosure is subjected to conductive treatment, thus avoiding the problem of large contact resistance caused by forming the electrode layer directly on the surface of the ferroelectric storage layer (this is because a natural passivation layer is prone to existing on the surface of the ferroelectric storage layer) and also reducing the action of the depolarization field. Therefore, the effect of the passivation layer on the surface of the ferroelectric storage layer on the domain wall current and data retention performance is reduced as much as possible, which ultimately further improves the ferroelectric domain retention and the magnitude of the read current.

Figure 4:
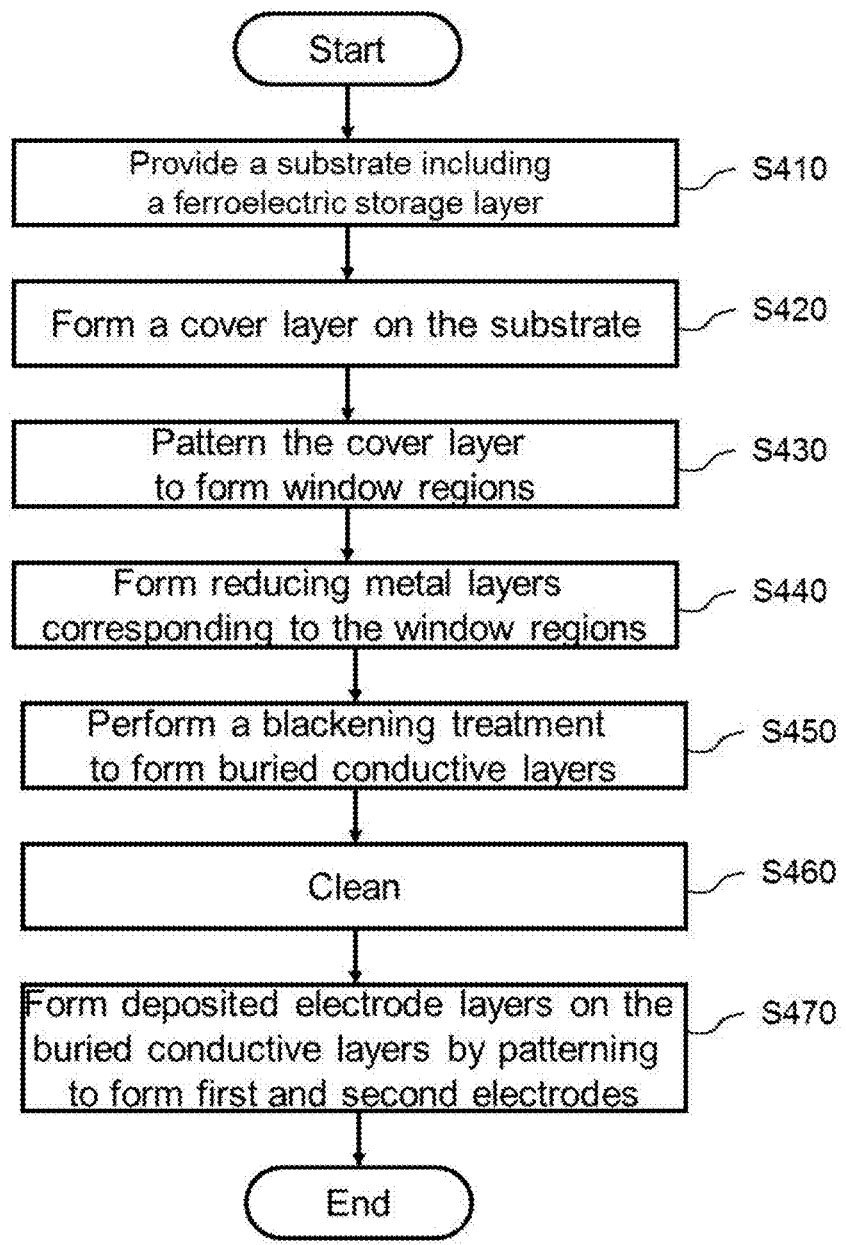
FIG. 4 is a flowchart of a method of preparing a ferroelectric memory according to an embodiment of the present disclosure.
Figure 5:
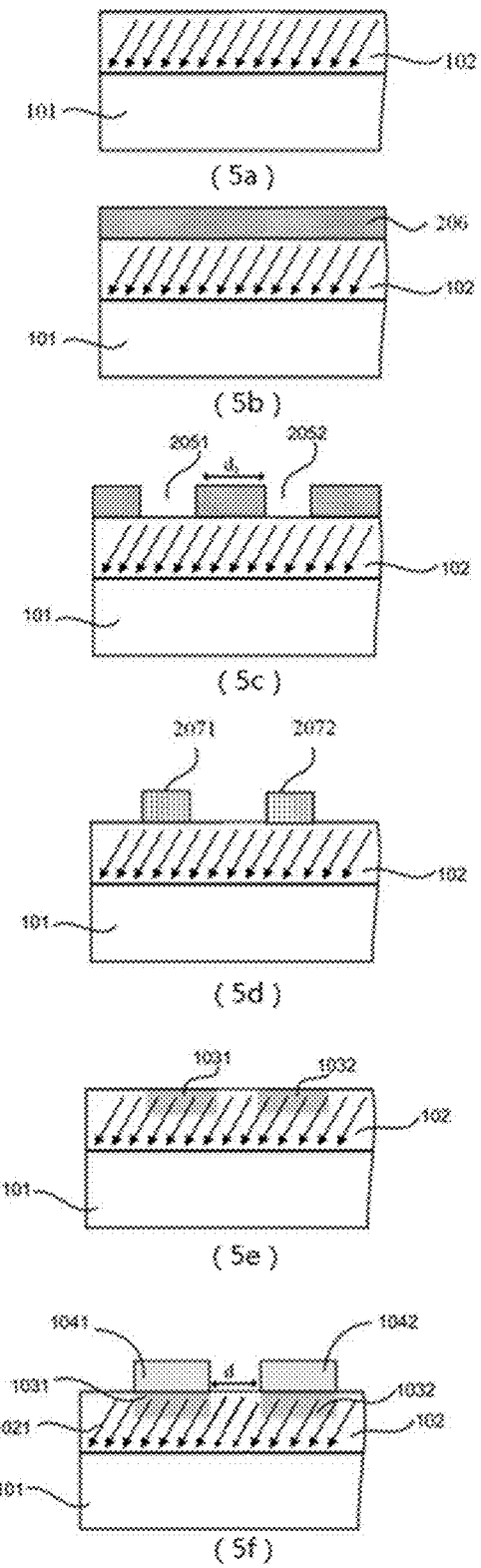
FIG. 5 shows process steps of the preparation method of the embodiment shown in FIG. 4 in partial cross-sectional structure change of the device, wherein FIG. (5a) shows forming a ferroelectric storage layer on a substrate, FIG. (5b) shows forming a cover layer on the substrate, FIG. (5c) shows patterning the cover layer, FIG. (5d) shows forming a reduction metal layer, FIG. (5e) shows performing blackening treatment, and FIG. (5f) shows forming a deposition electrode layer by patterning.

The ferroelectric memory of the embodiment shown in FIG. 1 above can be prepared by the method illustrated in FIGS. 4 and 5, and the preparation method will be exemplified below in conjunction with FIGS. 1, 4 and 5.

First, in step S410, a substrate including a ferroelectric storage layer is provided. In this step, as shown in FIG. (5a), the ferroelectric storage layer 102 may be formed on the substrate 101 by epitaxial growth, bonding, thin film deposition, etc.; the ferroelectric storage layer is selected from lithium tantalate ($LiTaO_3$), lithium niobate ($LiNbO_3$), or lithium tantalate ($LiTaO_3$) and lithium niobate ($LiNbO_3$) doped with MgO, $Mn_2O_5$, $Fe_2O_3$ or $La_2O_3$; or the ferroelectric storage layer is blackened lithium tantalate ($LiTaO_3$) or lithium niobate ($LiNbO_3$); the substrate 101 may be formed of various base materials commonly used in a ferroelectric memory, such as $SrTiO_3$ or $LiNbO_3$, or may also be other semiconductor substrates that are easily compatible with semiconductor CMOS process, such as Si; as to the ferroelectric storage layer 102, for specific selection and the like thereof, reference may be made to the above embodiments.

In step S420, as shown in FIG. (5b), a cover layer 206 is formed on the substrate 101. The cover layer 206 may specifically be a photoresist. For example, a layer of photoresist 206 is formed on the surface of the ferroelectric storage layer 102 of the substrate 101 by using a photoresist spinner.

In step S430, as shown in FIG. (5c), the cover layer 206 is patterned to form window regions 2051 and 2052 to be treated. The patterning treatment can be achieved through exposure of photolithography technology and the like, wherein the shape and/or size of the window region may be determined according to the shape and/or size of the buried conductive layer to be formed, so that the buried conductive layers 1031 and 1032 having the desired shape and/or size can be finally obtained. The window regions 2051 and 2052 expose the ferroelectric storage layer 102 to be subjected to conductive treatment.

In step S440, as shown in FIG. (5d), reduction metal layers 2071 and 2072 are formed corresponding to the window regions 2051 and 2052. In this step, a layer of reducing metal can be deposited by thin-film deposition processes such as magnetron sputtering, thermal evaporation, and electron beam thermal evaporation. Then, the remaining cover layer 206 is stripped to form reduction metal layers 2071 and 2072 by patterning as shown in FIG. (5d); wherein the reduction metal layers 2071 and 2072 are metals having a reducibility relative to the ferroelectric storage layer 102, and they may be one or more of lithium, chromium, iron, zinc, aluminum, magnesium, copper, cobalt, nickel, manganese, and titanium, optionally metals having a high reducibility such as zinc, aluminum, and iron; the thickness of the reduction metal layer may be selected from 10 nm to 500 nm.

In step S450, as shown in FIG. (5e), a blackening treatment is performed to form buried conductive layers 1031 and 1032 in the ferroelectric storage layer 102. In this step, through the blackening treatment, the concentration of, for example, oxygen vacancies on the partial surface of the ferroelectric storage layer 102 can be greatly increased, thereby completing the conductive treatment on the partial surface of the ferroelectric storage layer 102. In an embodiment, the substrate 101 can be placed in a vacuum, a protective atmosphere or a reducing atmosphere under a temperature condition of 100° C.-600° C., and burying-sintered in lithium magnesium silicate, lithium carbonate or lithium chlorine powder; specifically, the lithium carbonate powder can be placed in a quartz corundum crucible, the substrate 101 can be laid flat in a reducing agent of the lithium carbonate powder, and then the crucible is placed into a heat treatment furnace; then, the gas pressure in the heat treatment furnace is pumped to 5 pa, then a mixed gas of argon and hydrogen is applied for scrubbing for 5 min-20 min, and finally annealing is performed; when the temperature is lowered to room temperature, the furnace door is opened to take out the substrate, and the substrate will be formed thereon with the buried conductive layers 1031 and 1032 as shown in FIG. (5e); wherein the molar ratio of hydrogen to argon is optionally 1:100-7:100, and the gas flow rate is optionally 0.5 L/min-10 L/min; the blackening treatment temperature is optionally 100° C.-600° C. (for example, 450° C.), the heating rate is optionally controlled at 1-5° C./min, the constant temperature time is optionally 1-10 h, and the temperature raising and lowering rate is optionally 1-5° C./min.

In step S460, the blackened substrate is cleaned. In this step, first, a dilute hydrochloric acid solution (in which the ratio of concentrated hydrochloric acid to water is 1:2 (volume fraction ratio)) is used for cleaning, and the cleaning time may be 0.5-5 min; then, a sodium hydroxide solution (in which the ratio of sodium hydroxide powder to water is 30:100 (mass fraction ratio) is used for cleaning, and the cleaning time may be 0.5-5 min; finally, the substrate is rinsed by deionized water, dried, and baked on a hot plate at 90° C. for 2-10 min.

Figure 6:
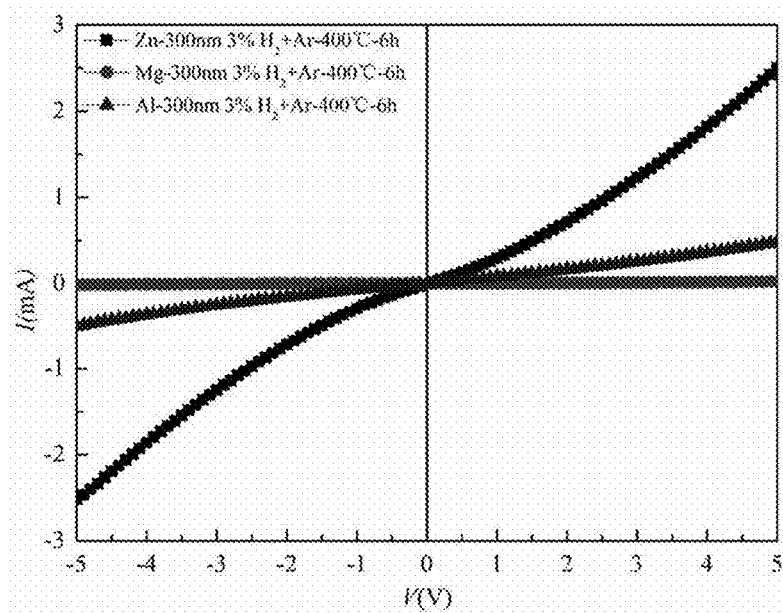
FIG. 6 shows an I-V test characteristic of a buried conductive layer formed by blackening treatment.

Taking the lithium niobate substrate as an example, it is observed that the color of the lithium niobate substrate is darker than that before the blackening treatment, which may indicate that the reduction reaction has occurred. A surface topography test can be performed by using an atomic force microscope (AFM) to determine that the surface of the substrate 101 (especially the surface of the ferroelectric storage layer 102) is flat. Current-voltage electrical measurement data shown in FIG. 6 indicates that the electrical conductivity of the blackened portion of the ferroelectric storage layer (i.e., the buried conductive layers 1031 and 1032) has been improved by 2-5 orders of magnitude; wherein FIG. 6 illustrates the I-V test characteristics of the buried conductive layers formed by the blackening treatment, wherein the I-V test results of three samples using three metals of Al, Mg and Zn as the reduction metal layer respectively are shown, with 300 nm indicating the thickness of the reduction metal layer, 3% $H_2$+Ar indicating that $H_2$ having a volume ratio of 3% is added to the argon gas, and 6 h indicating the time of burying-sintering treatment.

In step S470, as shown in FIG. (5*f*), deposited electrode layers 1041 and 1042 are formed on the buried conductive layers 1031 and 1032 by patterning, thereby forming a first electrode and a second electrode. In this step, the surface layer regions subjected to the reducing metal blackening treatment can be correspondingly patterned to form electrode layers 1041 and 1042 through a micro-nano processing, thereby forming a first electrode and a second electrode as a read-write electrode pair. A gap d exists between the electrode layers 1041 and 1042, and the width of the gap d is optionally greater than or equal to 2 nanometers and less than or equal to 1 micrometer; the positions of the electrode layers 1041 and 1042 may partially or completely overlap with the positions of the buried conductive layers 1031 and 1032 respectively; the thickness of the electrode layers 1041 and 1042 is optionally greater than or equal to 10 nanometers and less than or equal to 500 nanometers.

Hitherto, the ferroelectric memory shown in FIG. (5*f*) is basically prepared, wherein the electric domain between the buried conductive layers 1031 and 1032 maintains the initial polarization direction 1021 before the write signal $V_{write}$ as shown in FIG. 1 is biased. Through the write operation processing shown in FIG. 1, the domain wall conductive passage 109 having a unidirectional direct current conductive characteristic as shown in FIG. 1 can be formed.

Figure 7:
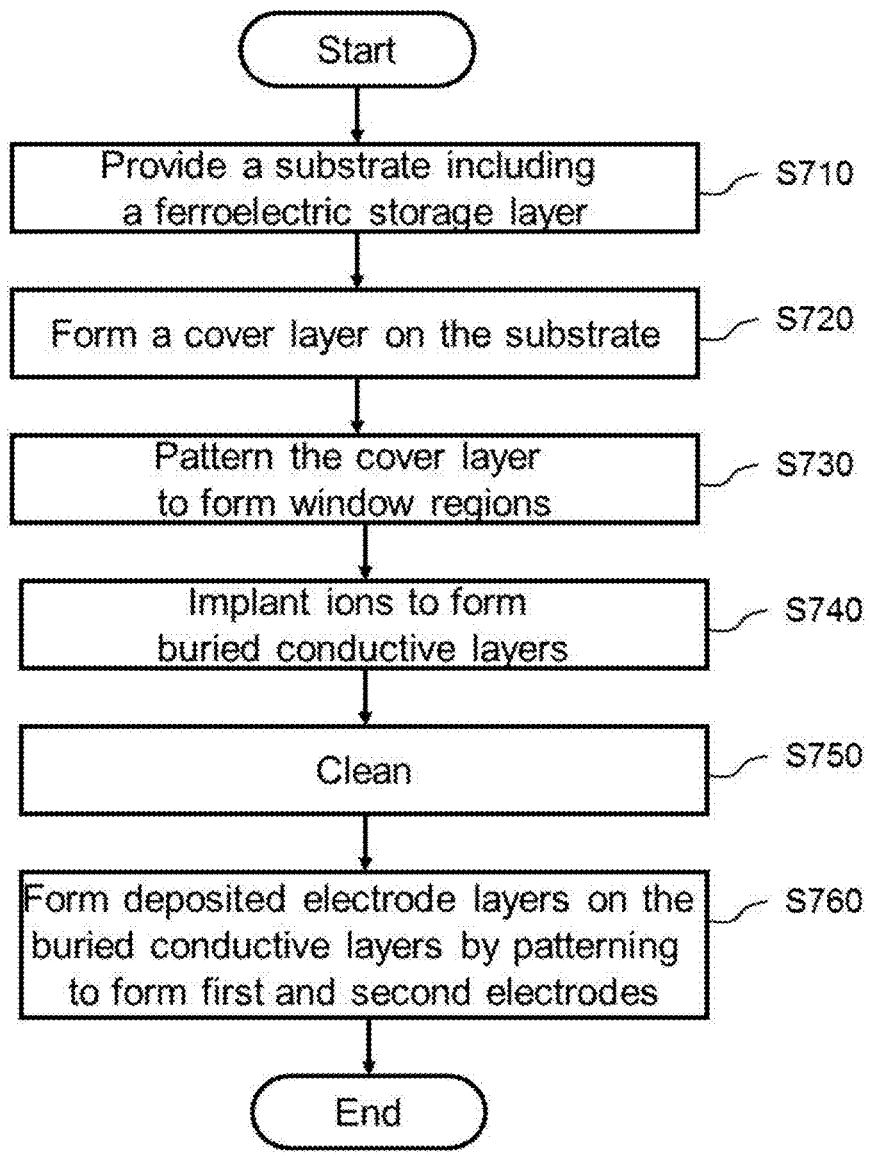
FIG. 7 is a flowchart of a method of manufacturing a ferroelectric memory according to another embodiment of the present disclosure.
Figure 8:
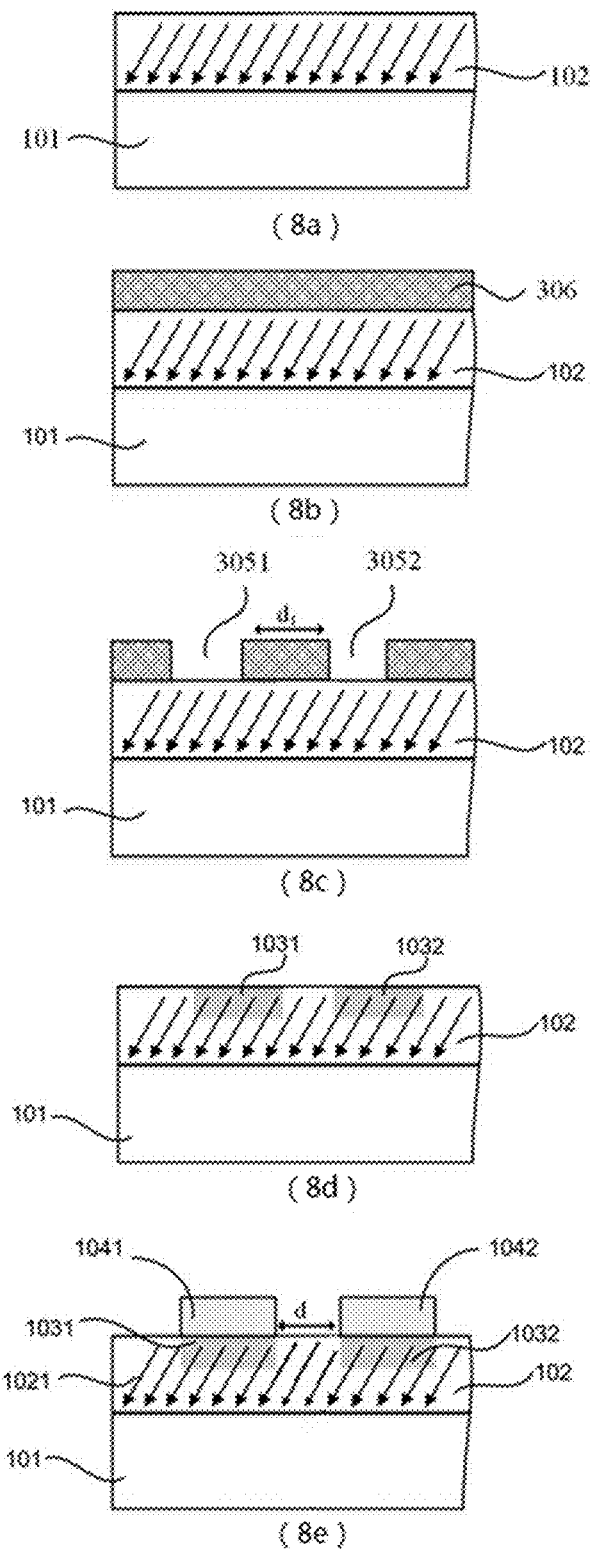
FIG. 8 shows process steps of the preparation method of the embodiment shown in FIG. 7 in partial cross-sectional structure change of the device, wherein FIG. (8a) shows forming a ferroelectric storage layer on a substrate, FIG. (8b) shows forming a cover layer on the substrate, FIG. (8c) shows patterning the cover layer, FIG. (8d) shows performing ion implantation treatment, and FIG. (8e) shows forming a deposition electrode layer by patterning.

The ferroelectric memory of the embodiment shown in FIG. 1 above can also be exemplarily prepared by the method illustrated in FIGS. 7 and 8. The preparation method is illustratively described below in conjunction with FIGS. 1, 7, and 8.

First, in step S710, a substrate including a ferroelectric storage layer is provided. This step is basically similar to step S410 of the above embodiment, and will not be repeatedly described herein.

In step S720, as shown in FIG. (8*b*), a cover layer 306 is formed on the substrate 101. The cover layer 306 may specifically be a photoresist. For example, a layer of photoresist 306 is formed on the surface of the ferroelectric storage layer 102 of the substrate 101 by using a photoresist spinner.

In step S730, as shown in FIG. (8*c*), the cover layer 306 is patterned to form window regions 3051 and 3052 to be treated. The patterning treatment can be achieved through optical exposure, electron beam exposure and the like, wherein the shape and/or size of the window region may be determined according to the shape and/or size of the buried conductive layer to be formed, so that the buried conductive layers 1031 and 1032 having the desired shape and/or size can be finally obtained. The window regions 3051 and 3052 expose the ferroelectric storage layer 102 to be subjected to conductive treatment.

In step S740, as shown in FIG. (8*d*), an ion implantation treatment is performed to form buried conductive layers 1031 and 1032 in the ferroelectric storage layer 102. In an embodiment, the window regions 3051 and 3052 are used as ion implantation regions, and the remaining cover layer 306 is used as a mask. One or more of aluminum, silver, gold, platinum, copper, cobalt, chromium, titanium, ruthenium and iridium is used as an ion implantation source to perform a diffusion treatment on the surface of the ferroelectric storage layer 102 of the window regions. Through the ion implantation treatment, the carrier concentration of the partial surface of the ferroelectric storage layer 102 can be greatly increased, thereby completing the conductive treatment of the partial surface of the ferroelectric storage layer 102.

In step S750, the substrate after ion implantation is cleaned. In this step, different cleaning solutions can be used according to different ion implantation sources; finally, the substrate is rinsed by deionized water, dried, and baked on a hot plate at 90° C. for 2-10 min.

In step S760, as shown in FIG. (8*e*), deposited electrode layers 1041 and 1042 are formed on the buried conductive layers 1031 and 1032 by patterning, thereby forming a first electrode and a second electrode. This step S760 is basically the same as the step S470 in the embodiment shown in FIG. 4 and will not be repeatedly described herein.

Figure 9:
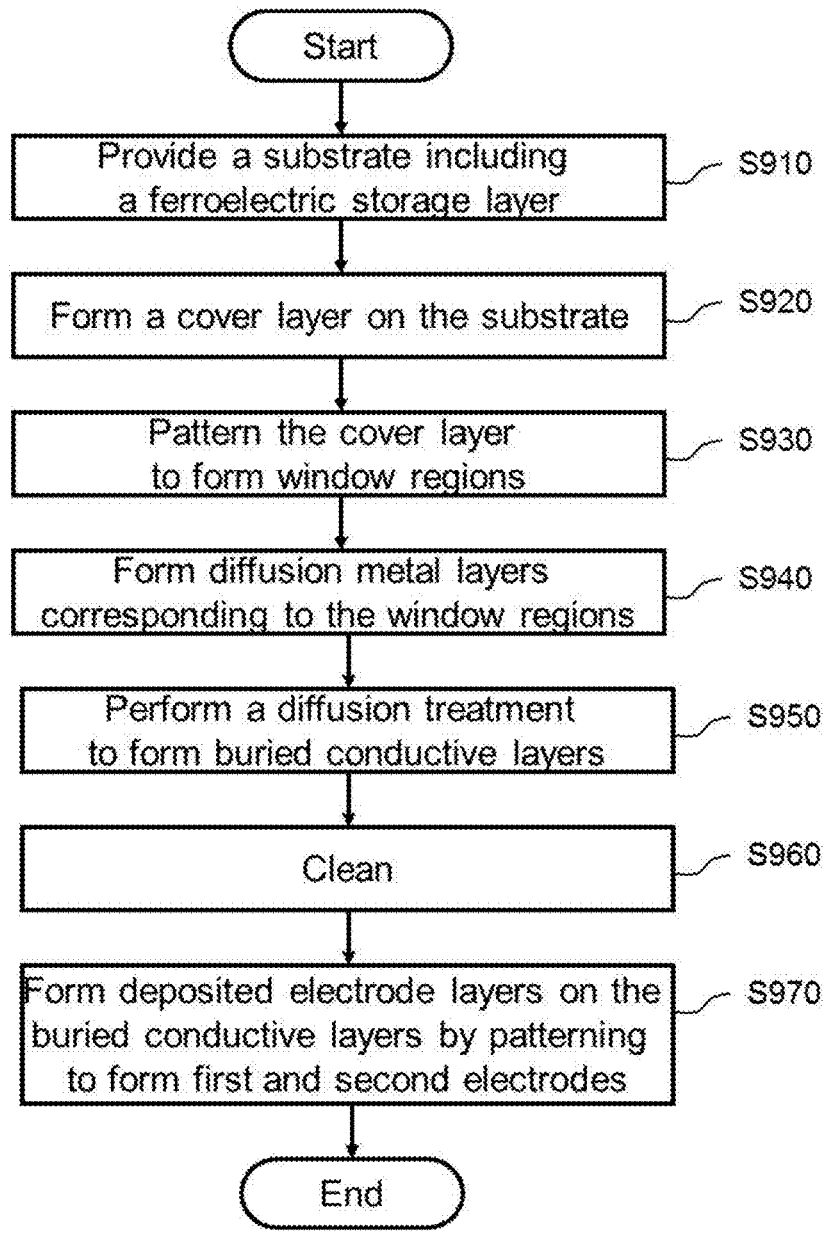
FIG. 9 is a flowchart of a method of manufacturing a ferroelectric memory according to still another embodiment of the present disclosure.
Figure 10:
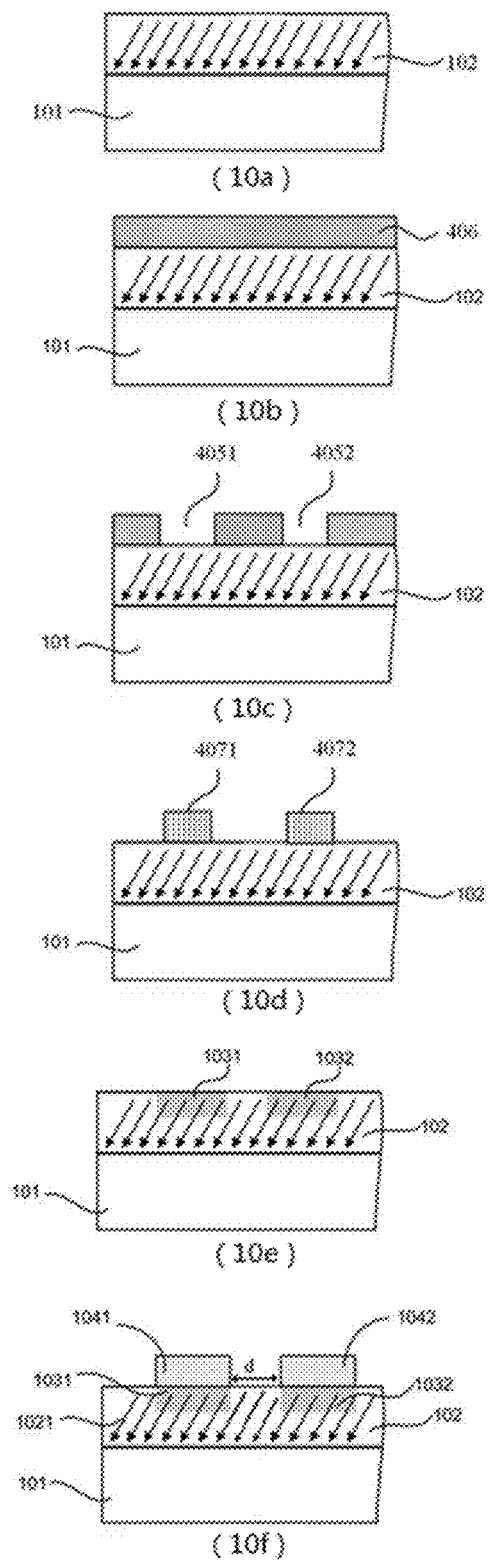
FIG. 10 shows process steps of the preparation method of the embodiment shown in FIG. 9 in partial cross-sectional structure change of the device, wherein FIG. (10a) shows forming a ferroelectric storage layer on a substrate, FIG. (10b) shows forming a cover layer on the substrate, FIG. (10c) shows patterning the cover layer, FIG. (10d) shows forming a reduction metal layer, FIG. (10e) shows performing diffusion treatment, and FIG. (10f) shows forming a deposition electrode layer by patterning.

The ferroelectric memory of the embodiment shown in FIG. 1 above can also be exemplarily prepared by the method illustrated in FIGS. 9 and 10. The preparation method is illustratively described below in conjunction with FIGS. 1, 9 and 10.

First, in step S910, a substrate including a ferroelectric storage layer is provided. In this step, as shown in FIG. (10*a*), the ferroelectric storage layer 102 may be formed on the substrate 101 by epitaxial growth, bonding, thin film deposition, etc.

In step S920, as shown in FIG. (10*b*), a cover layer 406 is formed on the substrate 101. The cover layer 406 may specifically be a photoresist. For example, a layer of photoresist 406 is formed on the surface of the ferroelectric storage layer 102 of the substrate 101 by using a photoresist spinner.

In step S930, as shown in FIG. (10*c*), the cover layer 406 is patterned to form window regions 4051 and 4052 to be treated. The window regions 4051 and 4052 expose the ferroelectric storage layer 102 to be subjected to conductive treatment.

In step S940, as shown in FIG. (10*d*), diffusion metal layers 4071 and 4072 are formed corresponding to the window regions 4051 and 4052. In this step, a layer of diffusion metal can be deposited by thin-film deposition processes such as magnetron sputtering, thermal evaporation, and electron beam thermal evaporation. Then, the remaining cover layer 406 is stripped to form diffusion metal layers 4071 and 4072 by patterning as shown in FIG. (10*d*); wherein the diffusion metal layers 4071 and 4072 may be one or more of silver, copper, chromium, cobalt, titanium, iridium, and ruthenium, optionally metals such as silver, copper, chromium, cobalt, and titanium. The thickness of the diffusion metal layers 4071 and 4072 is optionally 1 nm-500 nm (for example, 10 nm, 50 nm, or 100 nm).

In step S950, as shown in FIG. (10*e*), a diffusion treatment is performed to form buried conductive layers 1031 and 1032 in the ferroelectric storage layer 102. In this step, through the diffusion treatment, the concentration of carriers on the partial surface of the ferroelectric storage layer 102 can be greatly increased, thereby completing the conductive treatment on the partial surface of the ferroelectric storage layer 102. In an embodiment, the substrate 101 can be placed into a quartz corundum crucible, and then the crucible is placed into a heat treatment furnace for annealing treatment; then when the temperature is lower to room temperature, the furnace door is opened to take out the ferroelectric substrate; wherein the diffusion treatment temperature is 100° C.-700° C., the heating rate is controlled at 1-5° C./min, the constant temperature time is 1-10 h, and the temperature raising and lowering rate is 1-5° C./min.

In step S960, the substrate after the diffusion treatment is cleaned. In this step, different cleaning solutions are used for cleaning the substrate according to different diffusion metals; finally, the substrate is rinsed by deionized water, dried, and baked on a hot plate at 90° C. for 2-10 min.

In step S970, as shown in FIG. (10*f*), deposited electrode layers 1041 and 1042 are formed on the buried conductive layers 1031 and 1032 by patterning, thereby forming a first electrode and a second electrode. This step S970 is basically the same as the step S470 in the embodiment shown in FIG. 4 and will not be repeatedly described herein.

Hitherto, the ferroelectric memory shown in FIG. (10*f*) is basically prepared, wherein the electric domain between the buried conductive layers 1031 and 1032 maintains the initial polarization direction 1021 before the write signal $V_{write}$ as shown in FIG. 1 is biased. Through the write operation processing shown in FIG. 1, the domain wall conductive passage 109 having a unidirectional direct current conductive characteristic as shown in FIG. 1 can be formed.

The preparation methods of the above embodiment have a simple process and low cost, which can avoid the patterning treatment such as etching on the surface of the ferroelectric storage layer, and also form a structure like a programming projected block between the buried conductive layers in the ferroelectric storage layer.

In the above description, directional terms (e.g., "upper", "lower", etc.) and similar terms that are used to describe the components in various embodiments represent the directions shown in the drawings or directions that can be understood by those skilled in the art. These directional terms are used for a relative description and clarification, instead of limiting the orientation in any embodiment to a specific direction or orientation.

The above embodiments mainly describe the ferroelectric memory of the present disclosure as well as a method of preparing the same. In particular, the method and principle of read operation are described. While only some of the embodiments of the present disclosure are described, those skilled in the art will understand that the present disclosure can be carried out in many other forms without departing from the spirit and scope thereof. For example, the shapes of the first electrode and the second electrode can be changed; the electrode layers of the above embodiment are separately defined as the first electrode or the second electrode, but the buried conductive layers are still provided corresponding to the electrode layers; during the preparation process, in order to reduce the process steps, the electrode layer and the buried conductive layer may be formed synchronously, or even such as the diffusion treatment applied in the formation process of the buried conductive layer, is later than the formation of the electrode layer, etc. Therefore, the disclosed examples and embodiments should be considered as illustrative rather than limiting. The present disclosure can cover many variations and replacements without departing from the spirit and scope of the present disclosure defined by the appended claims.

What is claimed is:

1. A method of preparing a non-volatile ferroelectric memory, the method comprising:
   providing a substrate containing a ferroelectric storage layer;
   performing conductive treatment on a surface of the ferroelectric storage layer by patterning to form at least one pair of conductive layers, first and second portions of the at least one pair of conductive layers being completely buried in the ferroelectric storage layer; and
   depositing an electrode layer to form a first electrode and a second electrode each comprising a corresponding portion of the at least one pair of the conductive layers and a corresponding electrode layer formed on the corresponding portion of the at least one pair of the conductive layers,
   wherein a polarization direction of an electric domain in the ferroelectric storage layer is substantially not parallel with a normal line direction of the ferroelectric storage layer, and
   wherein in response to a write signal in a certain direction being applied between the first electrode and the second electrode, the electric domain of a part of the ferroelectric storage layer between the at least one pair of the conductive layers are enabled to be reversed, so that a domain wall conductive passage that electrically connects the first electrode and the second electrode is established.

2. The preparation method according to claim 1, comprising:
   performing a cleaning treatment after the conductive treatment.

3. The preparation method according to claim 1,
   wherein in performing conductive treatment, the surface of the ferroelectric storage layer is at least partially subjected to blackening treatment, diffusion treatment, or ion implantation treatment.

4. The preparation method according to claim 3,
   wherein in performing conductive treatment, one or more of lithium, chromium, iron, zinc, aluminum, magnesium, copper, cobalt, nickel, manganese and titanium are used to at least partially reduce the surface of the ferroelectric storage layer to realize the blackening treatment.

5. The preparation method according to claim 4,
   wherein during the blackening treatment, the substrate is placed in lithium magnesium silicate, lithium carbonate or lithium chlorine powder, and burying-sintered in a vacuum, a protective atmosphere or a reducing atmosphere under a temperature condition of 100° C.-600° C.

6. The preparation method according to claim 4,
   wherein the lithium, chromium, iron, zinc, aluminum, magnesium, copper, cobalt, nickel, manganese, or titanium used in performing conductive treatment is metal powders, or metal thin films formed by a thin film deposition process.

7. The preparation method according to claim 3, wherein in performing conductive treatment, one or more of silver, copper, chromium, cobalt, titanium, iridium and ruthenium are used as a diffusion source to diffuse onto the surface of the ferroelectric storage layer.

8. The preparation method according to claim 7, wherein in performing conductive treatment, growth of the diffusion source occurs at a temperature required for the diffusion treatment, so that generation of the diffusion source occurs in synchronization with the diffusion treatment.

9. The preparation method according to claim 7, wherein the silver, copper, chromium, cobalt, titanium, iridium or ruthenium used in performing conductive treatment is metal powders, or metal thin films formed by a thin film deposition process.

10. The preparation method according to claim 1, wherein in performing conductive treatment, one or more of aluminum, silver, gold, platinum, copper, cobalt, chromium, titanium, ruthenium and iridium are used as an ion implantation source to implant metal ions onto the surface of the ferroelectric storage layer.

11. The preparation method according to claim 1, wherein a diffused metal layer is formed before the electrode layer is deposited, and the diffused metal layer performs a diffusion treatment on the surface of the ferroelectric storage layer at a same time of depositing the electrode layer or after the electrode layer is deposited to complete the conductive treatment.

12. The preparation method according to claim 1, wherein the conductive layer forms an ohmic contact with the electrode layer.

13. The preparation method according to claim 1, wherein the resistivity of the conductive layer is of the order of $10^{-5}$–$10^{12}\Omega\cdot cm$.

14. The preparation method according to claim 1, wherein a contact resistance of the conductive layer and the electrode layer is less than or equal to 50MΩ.

15. The preparation method according to claim 1, wherein the surface of the ferroelectric storage layer that is used for forming the conductive layer through the conductive treatment is a planar surface, an uneven surface or an irregularly shaped surface, and the conductive layer extends inward from the surface of the ferroelectric storage layer.

16. The preparation method according to claim 1, wherein the electrode layer partially or completely covers the conductive layer.

* * * * *